(12) United States Patent
Kuroe et al.

(10) Patent No.: US 10,651,130 B2
(45) Date of Patent: May 12, 2020

(54) DISPLAY DEVICE

(71) Applicant: SHARP KABUSHIKI KAISHA, Sakai, Osaka (JP)

(72) Inventors: Yasuhiro Kuroe, Sakai (JP); Yoshihiro Shioaku, Sakai (JP); Noriyuki Ohashi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/371,604

(22) Filed: Apr. 1, 2019

(65) Prior Publication Data

US 2019/0304921 A1 Oct. 3, 2019

(30) Foreign Application Priority Data

Apr. 2, 2018 (JP) ................. 2018-070725

(51) Int. Cl.
| | |
|---|---|
| *G02F 1/1345* | (2006.01) |
| *H01L 23/544* | (2006.01) |
| *H01L 27/12* | (2006.01) |
| *H01L 27/32* | (2006.01) |

(52) U.S. Cl.
CPC ........ *H01L 23/544* (2013.01); *G02F 1/13458* (2013.01); *H01L 27/124* (2013.01); *H01L 27/3223* (2013.01); *H01L 27/3276* (2013.01); *H01L 2223/54433* (2013.01)

(58) Field of Classification Search
CPC .................................................. G02F 1/13458
See application file for complete search history.

(56) References Cited

U.S. PATENT DOCUMENTS

2017/0092593 A1* 3/2017 Kim ...................... H01L 23/544

FOREIGN PATENT DOCUMENTS

JP 2003-255853 A 9/2003

\* cited by examiner

*Primary Examiner* — Edmond C Lau
(74) *Attorney, Agent, or Firm* — ScienBiziP, P.C.

(57) ABSTRACT

A display device includes a display section including a first substrate and a second substrate, the display section displaying an image according to an electric signal, a terminal pad electrically connecting a conductor to a signal source or a ground node, and an information code expressing optically-readable information. The second substrate has a substrate overlapping area overlapping the first substrate in a plan view and a substrate non-overlapping area not overlapping the first substrate. At least a part of the terminal pad serves as a light-transmitting portion. The terminal pad and the information code are disposed in the substrate non-overlapping area on one plate surface of the second substrate such that they overlap each other in a plan view, with the light-transmitting portion covering the information code from above.

9 Claims, 7 Drawing Sheets

DISPLAY DEVICE

CROSS REFERENCE TO RELATED APPLICATION

This application claims priority from Japanese Patent Application No. 2018-070725 filed on Apr. 2, 2018. The entire contents of the priority application are incorporated herein by reference.

TECHNICAL FIELD

The technology described herein relates to a display device.

BACKGROUND

A display panel having an electrooptical substance sealed between a first substrate and a second substrate with a plate surface larger in area than a plate surface of the first substrate is known as a display means that displays an image according to an electric signal. The electrooptical substance is a substance whose optical characteristics, such as transmittance and luminance, change depending on electric signals (current signals or voltage signals) supplied to the substance. Examples of such a substance include liquid crystal and organic EL material. The second substrate has a substrate overlapping area defined such that the substrate overlapping area overlaps the first substrate in a plan view, and a substrate non-overlapping area defined such that, with one side edge of the second substrate extending out from one side edge of the first substrate, the substrate non-overlapping area does not overlap the first substrate. In an image display area in the substrate overlapping area, an electric signal is supplied to the electrooptical substance disposed in the image display area, and an image that can be read from the outer surface side of the first substrate is displayed. In the substrate non-overlapping area, electronic components or the like for supplying electric signals are mounted by a chip-on-glass (COG) method, and a terminal pad, to which a transmission component or the like for transmitting electric signals is connected, is formed. In the substrate non-overlapping area, an information code describing information for management of substrate production/inspection history may also be provided.

In recent years, the display panel has been modified in shape to give it a special form and reduced in frame size, which has led to a reduction in the area of the substrate non-overlapping area. To deal with this trend, efforts are being made to reduce the size of the terminal pad and information code. At the same time, a technology for placing the terminal pad and information code on the substrate in a space-saving manner is in demand.

According to Patent Document 1, an identification symbol (equivalent to the information code) that can be read from the back surface side of a display panel, i.e., the outer surface side of an array substrate (equivalent to the second substrate) is disposed at a location overlapping an inter-substrate conduction area, where the array substrate is electrically connected to a counter substrate (equivalent to the first substrate) via an inter-substrate conductive material, in a plan view. This technology provides a configuration that secures an identification symbol formation area while dealing with a reduction in the frame size of the display panel.

[Patent Document 1] Japanese Unexamined Patent Application Publication No. 2003-255853

According to the above liquid crystal display device, the identification symbol is disposed overlappingly on the back surface side of an element (inter-substrate conductive material) having a specific function in the display panel to offer a space-saving effect. However, a transmissive liquid crystal display device of an ordinary structure has a backlight unit attached to the outer surface side of the array substrate, i.e., back surface side of the display panel. Because of this configuration, to read an identification symbol pattern from the back surface side of the display panel after the display device is completed, the backlight unit must be removed. Meanwhile, the counter substrate has a nontransparent shading layer (black matrix (BM) layer) disposed at a location overlapping the inter-substrate conduction area in a plan view. To read the identification symbol pattern from the front surface side (image display surface side) of the display panel, therefore, an opening must be created on the shading layer. Such an opening, however, raises a concern that light may leak from the opening. For the above reasons, after the liquid crystal display device is completed, the identification symbol pattern cannot be read easily from both front surface side and back surface side.

SUMMARY

The technology described herein was made in view of the above circumstances. An object is to dispose an information code that can be read easily after completion of a display device in a substrate non-overlapping area in a space-saving manner.

A display device described herein includes a display section including a first substrate and a second substrate, the display section displaying an image according to an electric signal, a terminal pad that electrically connects a conductor provided on the first substrate or the second substrate to a signal source that supplies the electric signal or to a ground node, and an information code expressing information in an optically readable form. The second substrate has a substrate overlapping area defined such that the substrate overlapping area overlaps the first substrate in a plan view, and a substrate non-overlapping area that does not overlap the first substrate such that one side edge of the second substrate extends out from one side edge of the first substrate. At least a part of the terminal pad serves as a light-transmitting portion configured to transmit light. The terminal pad and the information code are disposed in the substrate non-overlapping area on one plate surface of the second substrate, the plate surface facing the first substrate, such that the terminal pad and the information code overlap each other in a plan view and the light-transmitting portion covers an upper surface of the information code.

In the above description, "conductor" refers to lines made of conductive materials, such as metal and conductive resins, and also to conductive members, such as electrodes. "Electrically connects" refers not only to the case where conductive members are in direct contact with each other but also to a case where conductive members are in indirect contact with each other via another conductive member. "Light-transmitting portion configured to transmit light" should preferably be a transparent material that transmits visible light, but is not limited to such a material. "Light-transmitting portion configured to transmit light" may also be a material that transmits light with a specific wavelength, such as infrared and laser. If scanning the material with such light with a specific wavelength allows reading the information expressed by the information code, the material serves as the "light-transmitting portion".

According to the above configuration, the information code is disposed such that it overlaps the terminal pad in a plan view. As a result, the information code is placed in the substrate non-overlapping area in a space-saving manner. Since the information code is disposed in the lower layer side to the light-transmitting portion making up a part of the terminal pad in the substrate non-overlapping area on one plate surface of the second substrate, the information code can be read optically from above the terminal pad. In a display device production process, a nontransparent conductive tape or conductive paste, which forms a part of a conductive path, may be attached or applied to the upper surface of the light-transmitting portion of the terminal pad after formation of the information code and the terminal pad. In such a case, by removing or wiping the conductive tape or conductive paste away, using alcohol or the like, on a necessary basis, the information code can be optically read from above the terminal pad, that is, from the front surface side of the display panel. After the information is read, the conductive tape or conductive paste is attached or applied again to the upper surface of the light-transmitting portion. This makes the display device ready to be used. Usually, a transparent substrate is used as the second substrate. In this case, the information code can be read from the other plate surface side of the second substrate, that is, the back surface side of the display panel, which is the display means. For this reason, the transparent substrate is suitable for use in a reflective display device and an organic EL display device both of which do not require a backlight unit to be attached to the back surface side of the display panel. As described above, according to the technology described herein, the information code that can be read easily after completion of the display device can be placed in the substrate non-overlapping area in a space-saving manner.

According to the technology described herein, for example, management of traceability of the display device (production/inspection history management) can be carried out as problems posed by a reduction in the substrate non-overlapping area, which results from a modification in shape and a reduction in frame size of the display panel, are dealt with. Information expressed by the information code is not limited to one related to traceability management. Various pieces of information may be attached to the display device using the information code.

DETAILED DESCRIPTION

First Embodiment

Figure 1:
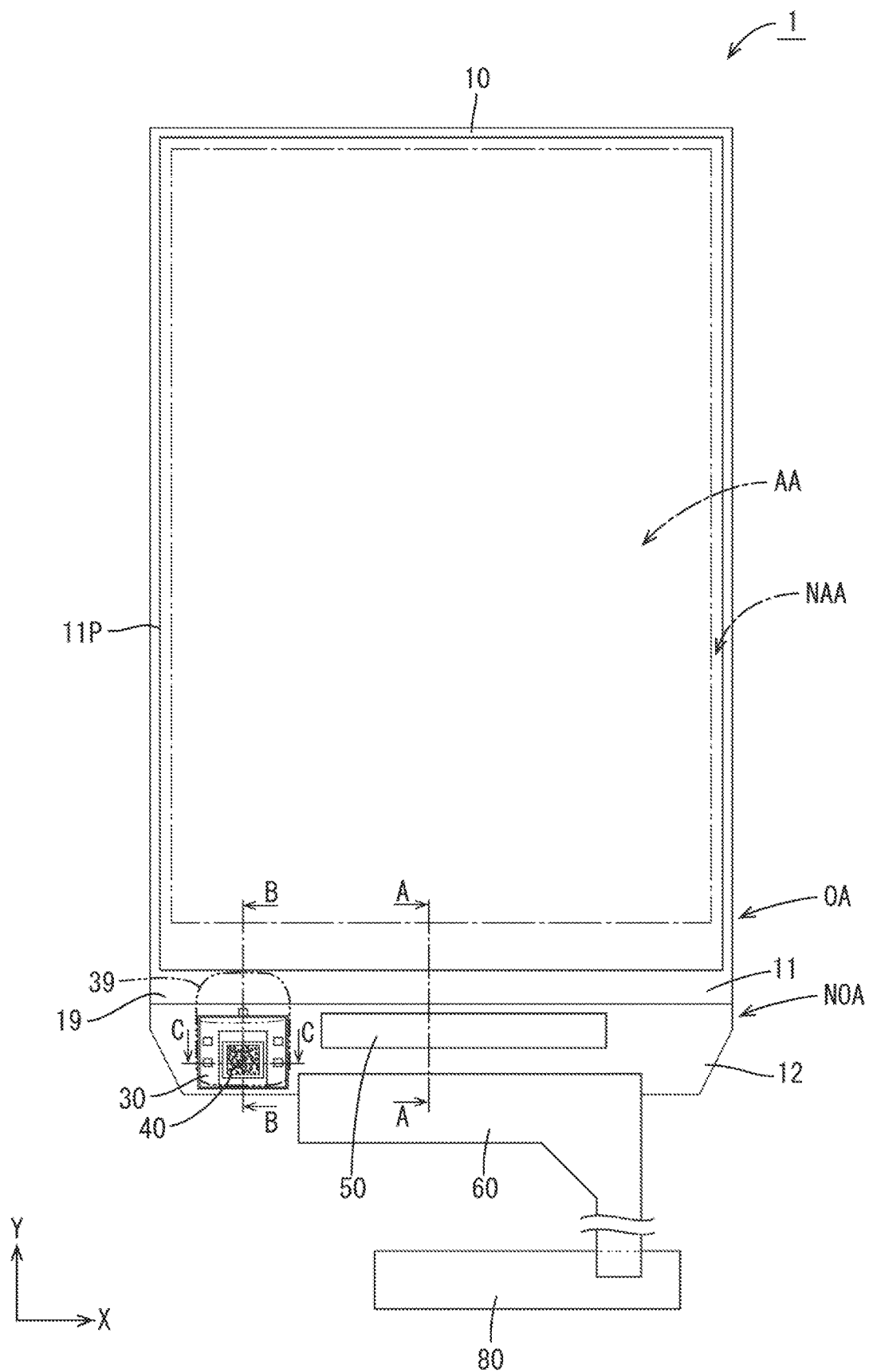
FIG. 1 is a diagrammatical view schematically showing a plan configuration of a liquid crystal panel of a liquid crystal display device according to a first embodiment.

A first embodiment will be described in detail with reference to FIGS. 1 to 5. In the first embodiment, a liquid crystal display device 1 (an example of a display device) having a position input function will be described. Some of the drawings have the X-axis, the Y-axis, and the Z-axis described therein such that they point the same X, Y, and Z directions in each drawing. The upper side indicated in FIGS. 2, 3, 6, and 8 is defined as the front side, while the lower side indicated in the same is defined as the back side. A group of the same members may be given reference numerals in such a way that a reference numeral is given to one member and is not given to the rest.

The liquid crystal display device 1 according to the first embodiment is for use in various electronic devices, such as cellular phone terminals including smart phones, notebook PCs including tablet PCs, wearable terminals including smart watches, portable information terminals including electronic books and personal digital assistances (PDAs), portable game machines, and digital photo frames. For applications in these electronic devices, the size of the screen of a liquid crystal panel 10 is limited to a size ranging from several inches to score of inches. The liquid crystal display device 1 is thus generally classified in the small-sized or mid-sized category. The technology described herein is not limited in application to such a display device. The technology is nevertheless found particularly usable for applications in display devices relatively small as a whole and having the substrate non-overlapping area of a small size.

A configuration of the liquid crystal display device 1 will be described schematically.

As shown in FIG. 1, the liquid crystal display device 1 includes at least the liquid crystal panel 10 (an example of a display means) of a vertically elongated rectangle as a whole, the liquid crystal panel 10 displaying an image on its front surface, and a backlight unit attached to the back surface side of the liquid crystal panel 10, the backlight unit emitting light for displaying an image. The backlight unit has light sources, such as LEDs, that emit white light onto the liquid crystal panel 10, and an optical member or the like that acts optically on light from the light sources, thereby transforms the light into a planar beam of light. The liquid crystal panel 10 to be described according to the first embodiment is a so-called in-cell type touch panel having a touch panel sensor built therein. This in-cell type touch panel structure will be described later with reference to FIG. 2. On the front side of the liquid crystal panel 10, for example, a frame-like member (bezel) may be disposed such that it encircles a peripheral part (non-display area NAA, which will be described later) of the liquid crystal panel 10 to hold the peripheral part.

The liquid crystal panel 10 will be described.

As shown in FIG. 1, the liquid crystal panel 10 is of a vertically elongated rectangle as a whole, and has long sides extending in the direction of the Y-axis and short sides extending in the direction of the X-axis. The liquid crystal panel 10 is divided into a display area (active area) AA in which an image can be displayed, and a non-display area (non-active area) NAA which is of a frame shape encircling the display area AA and in which no image can be displayed. In FIG. 1, a single-dot chain line draws a frame slightly smaller than a color filter (CF) substrate 11 to indicate an outline of the display area AA. An area outside the single-dot chain line is the non-display area NAA.

The liquid crystal panel 10 is constructed by pasting a pair of substrates 11 and 12 together. One of the substrates on the front side is the CF substrate 11 (counter substrate that is equivalent to a first substrate), and the other on the back side (rear side) is an array substrate 12 (substrate for the display device or active matrix substrate that is equivalent to a second substrate). The liquid crystal panel 10 displays an image such that the image can be visually recognized on the front surface, i.e., an outer plate surface of the CF substrate 11. As shown in FIG. 1, the array substrate 12 is larger in plate surface area than the CF substrate 11, and is substantially equal in short side length with the CF substrate 11 but is larger in long side length than the CF substrate 11. The array substrate 12 is pasted to the CF substrate 11 such that a side edge of the array substrate 12, the side edge being equivalent to one short side (short side on the upper side indicated in FIG. 1), is matched to the corresponding side edge of the CF substrate 11. As a result, another side edge (one of four side edges) of the array substrate 12, the side edge being equivalent to the other short side (short side on the lower side indicated in FIG. 1), extends out from a lower side edge (one of four side edges) of the CF substrate 11. This creates an area that is present as a given range in which the CF substrate 11 does not overlap the array substrate 12. The array substrate 12 thus has an area that overlaps the CF substrate 11 in a plan view and that is defined as a substrate overlapping area OA, and an area that does not overlap the CF substrate 11 in a plan view and that is defined as a substrate non-overlapping area NOA. As shown in FIG. 1, the above display area AA is defined in the center of the substrate overlapping area OA, and the peripheral end of the substrate overlapping area OA serves as the non-display area NAA. The substrate non-overlapping area NOA as a whole serves as the non-display area NAA. In the substrate non-overlapping area NOA, various electronic components for supplying various signals related to a display function and a touch panel function are mounted. The array substrate 12 according to the first embodiment has its two corners beveled at the substrate non-overlapping area NOA to give the array substrate 12 a special form. This reduces the area of the substrate non-overlapping area NOA.

Figure 2:
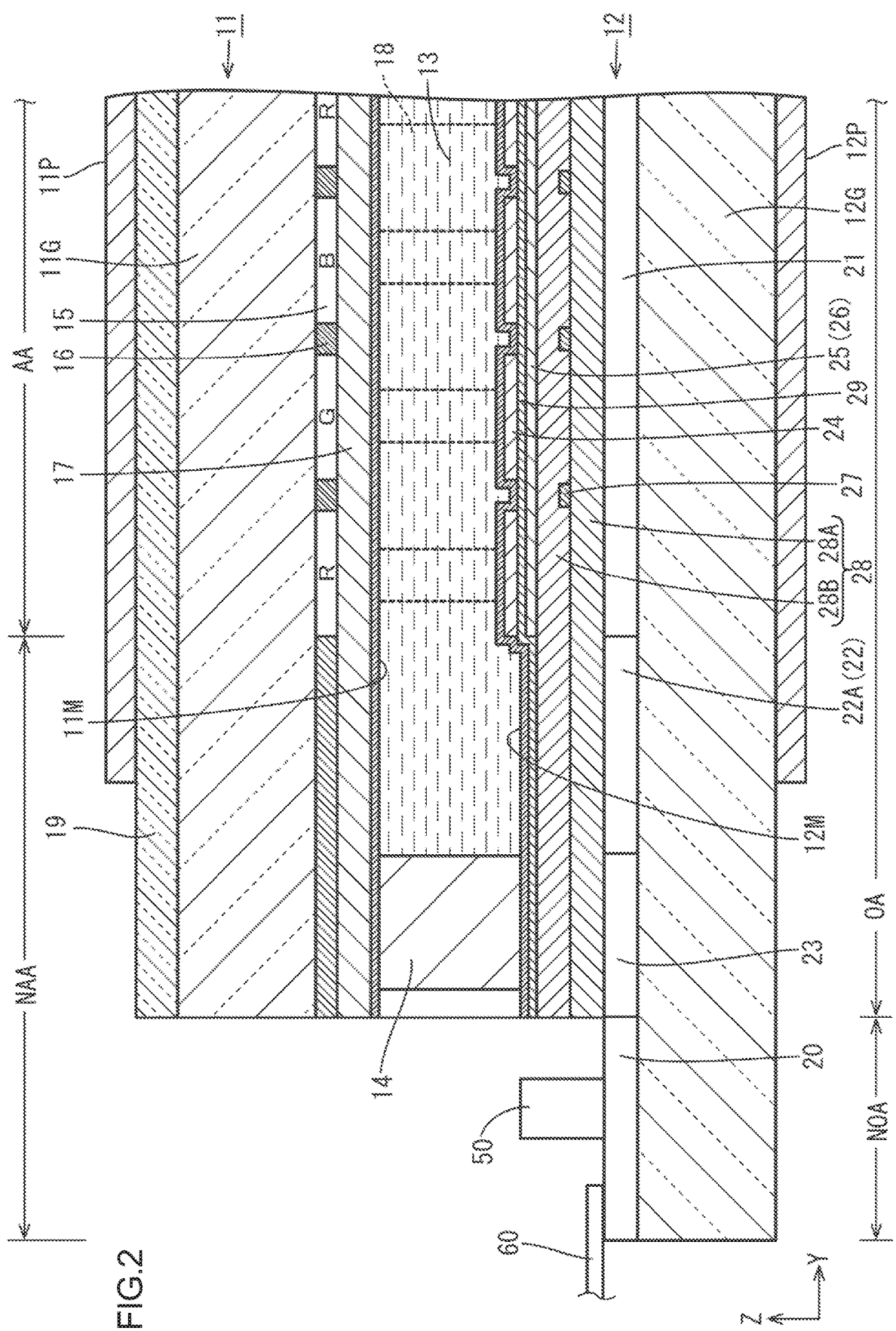
FIG. 2 is a diagrammatical view schematically showing a configuration of a section taken along an A-A line of FIG. 1.
Figure 3:
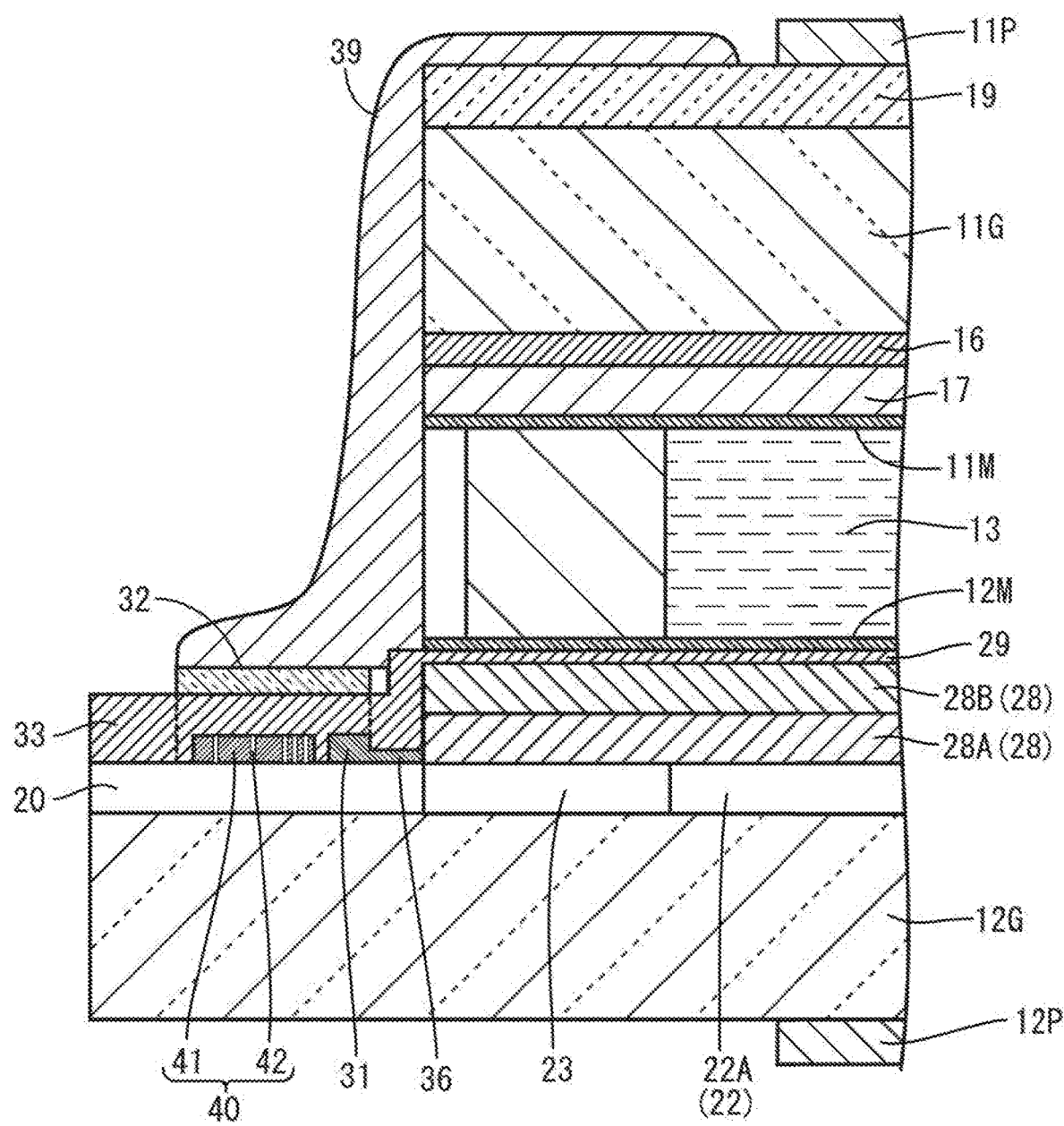
FIG. 3 is a diagrammatical view schematically showing a configuration of a section taken along a B-B line of FIG. 1.

Between the pair of substrates 11 and 12 facing each other, as shown in FIGS. 2 and 3, at least a liquid crystal layer 13 including liquid crystal molecules, which are electrooptical substances, and a seal 14 that seals the liquid crystal layer 13 are interposed. The seal 14 is disposed between the substrates 11 and 12 in such a way as to extend along the whole of the peripheral end of the substrate overlapping area OA, the peripheral end serving as the non-display area NAA, and is therefore formed into a rectangular frame shape (endless loop) as a whole in a plan view. This seal 14 holds a gap (cell gap) as thick as the liquid crystal layer 13 at the peripheral end of the substrates 11 and 12. In a process of producing the liquid crystal panel 10, the seal 14 is formed when the CF substrate 11 and the array substrate 12, which are manufactured separately, are pasted together. As a result, the seal 14 is brought into contact with the innermost surface of the peripheral end of the substrates 11 and 12 and is located on respective uppermost layers of the substrates 11 and 12. A shown in FIG. 2, photo spacers 18 for holding the cell gap are interposed between the substrates 11 and 12 in the display area AA. On the outermost surface of the substrate 11 and that of the substrate 12, a polarizer 11P and a polarizer 12P are pasted, respectively.

The internal structure of the liquid crystal panel 10 will then be described with reference to FIGS. 2 and 3. In FIGS. 2 and 3, various structural elements making up the internal structure are depicted in their simple forms.

The CF substrate 11 and the array substrate 12 have a transparent glass substrate 11G and a transparent glass substrate 12G, the glass substrates 11G and 12G being made of non-alkali glass, quartz glass, or the like, respectively. On each of the glass substrates 11G and 12G, a stack of films is formed by a known method, such as photolithography.

A structure formed in the substrate overlapping area OA of the array substrate 12 will be described.

As shown in FIGS. 2 and 3, on the inner surface (surface on the front side or a plate surface facing the CF substrate 11) of the glass substrate 12G, a pixel circuit 21 is disposed in the display area AA, and a peripheral circuit 22 and a connection portion 23 are disposed in the non-display area NAA. The pixel circuit 21, the peripheral circuit 22, and the connection portion 23 are overlaid with a flattening layer 28 of a double-layer structure on the upper layer side. In the display area AA, the flattening layer 28 is overlaid with a common electrode 25 functioning also as touch electrodes 26, an inter-electrode insulating layer (inter-layer insulating layer) 29, and pixel electrodes 24 that are stacked in increasing order on the upper layer side.

The pixel circuit 21 formed in the display area AA of the glass substrate 12G has at least gate lines (scanning lines) that transmit scanning signals, source lines (signal lines) that transmit image signals, and thin film transistors (TFTs) serving as switching elements connected to the gate lines and the source lines. This configuration is not depicted in detail here.

The gate lines are formed of a first metal layer formed on the upper surface of the glass substrate 12G. A number of the gate lines extend in the direction of the X-axis and are arranged at intervals along the direction of the Y-axis. The source lines are formed of a second metal layer located above the first metal layer via a gate insulating layer made of a transparent insulating material, such as silicon nitride (SiNx) and a silicon oxide (SiOx, e.g., x=2). A number of the source lines extend in the direction of the Y-axis and are arranged at intervals along the direction of the X-axis. The first metal layer and the second metal layer are made of a metal material, such as copper and titanium. Each of the TFTs is of a known structure, and has a channel of a semiconductor layer made of an oxide semiconductor material, such as indium gallium zinc oxide (IGZO). The TFTs are connected not only to the gate lines and the source lines but also to the pixel electrodes 24 through contact holes formed on the flattening layer 28. This configuration is not shown in FIG. 2. The TFT is driven based on a scanning signal transmitted to the gate line, and an image signal is transmitted to the source line through the channel of the TFT. The image signal is thus supplied to the pixel electrode 24, which is charged to have a given potential.

In an upper layer located above the pixel circuit 21 via the flattening layer 28 and other layers, the pixel electrodes 24 are formed of a second transparent electrode layer. In the display area AA, the TFTs and the pixel electrodes 24 are arranged in an area encircled with the gate lines and source lines in a plan view such that a number of the TFTs and the pixel electrodes 24 are lined up along the directions of the X-axis and Y-axis in a matrix pattern. In a lower layer located below the pixel electrodes 24 via the inter-electrode insulating layer 29, the common electrode 25 is formed of a first transparent electrode layer. The first transparent electrode layer as well as the second transparent electrode layer is made of a transparent electrode material, such as indium tin oxide (ITO). The inter-electrode insulating layer 29 located between the pixel electrodes 24 and the common electrode 25 is made of, for example, the same material as the material making up the above-mentioned gate insulating layer. The common electrode 25 according to the first embodiment functions also as an electrode that detects a change in capacitance caused by position input (touch electrodes 26, which will be described later). The common electrode 25 has an overall size equal to the size of the display area AA but is divided into latticed segments. Each of the segments is much larger than each pixel electrode 24, overlaps several pixel electrodes 24, and is connected separately to a driver 50, which will be described later. At least in an image display period, a substantially equal reference voltage is supplied to each segment of the common electrode 25. This creates a potential difference between the segment and the pixel electrodes 24 charged to have the given potential. An electric field created by a potential difference between the common electrode 25 and the pixel electrodes 24 includes a component acting along the plate surface of the array substrate 12 and includes also a fringe field (oblique field) containing a component acting in the direction of a normal to the plate surface of the array substrate 12. The liquid crystal panel 10 thus operates in so-called fringe field switching (FFS) mode in which the fringe field is used to control an oriented state of liquid crystal molecules included in the liquid crystal layer 13. In an image non-display period, as it will be described in detail later, each segment making up the common electrode 25 functions as the touch electrode 26, and the driver 50, to which each touch electrode 26 is connected separately, calculates a change in capacitance, thereby identifies an input position in the display area AA (in-cell touch panel function).

The peripheral circuit 22 formed on the glass substrate 12G in the non-display area NAA includes a pair of gate driver circuits, a pre-charge circuit, and a source shared driving (SSD) circuit 22A.

The gate driver circuits are disposed on a pair of long side portions of the non-display area NAA of the array substrate 12, respectively, and extend along the direction of the Y-axis to substantially cover the whole length in the direction of the Y-axis of the display area AA. Each of the gate driver circuits is connected to the gate lines lead out of the display area AA, thus scanning the gate lines one by one in sequence to drive each TFT. The pre-charge circuit is disposed on a short side portion of the non-display area NAA of the array substrate 12, the short side portion being opposite to another short side portion on which the driver 50 is mounted, and extends along the direction of the X-axis to substantially cover the whole length in the direction of the X-axis of the display area AA. The pre-charge circuit is connected to the source lines lead out of the display area AA toward the side opposite to the driver 50 side. The pre-charge circuit, for example, has a pre-charge function of supplying a pre-charge signal to each source line and charging each pixel electrode 24 to give it a given potential in advance before the driver 50 supplies an image signal to each source line. The SSD circuit 22A is disposed on the short side portion of the non-display area NAA of the array substrate 12, the short side portion having the driver 50 mounted thereon, and extends along the direction of the X-axis to substantially cover the whole length in the direction of the X-axis of the display area AA. The SSD circuit is connected to the source lines lead out of the display area AA toward the driver 50 side. The SSD circuit has a switch function of distributing incoming image signals from the driver 50 to respective source lines.

The above-described peripheral circuit 22 substantially encircles the whole periphery, i.e., four sides of the display area AA of a rectangle in a plan view. In the peripheral circuit 22 shown in FIGS. 2 and 3, the SSD circuit 22A is disposed. In a plan view, the peripheral circuit 22 is disposed inwardly relative to the seal 14 in the non-display area NAA, where the peripheral circuit 22 is located adjacent to the display area AA and between the connection portion 23 and the pixel circuit 21. The peripheral circuit 22 thus does not overlap the seal 14. The above circuits are each connected to the driver 50 through connection lines disposed on a base wiring portion 20, which will be described later.

The circuits included in the peripheral circuit 22 are each composed of lines formed of the first metal layer and second metal layer making up the gate lines and source lines, circuit elements, such as TFTs, formed of these metal layers and the semiconductor layers making up the above channels, and an insulating film formed of the gate insulating layer. In other words, the circuits are formed monolithically on the glass substrate 12G using these metal layers and semiconductor layers arranged in the non-display area NAA, as base materials.

The connection portion 23 connects the lines making up the peripheral circuit 22, the source lines, and the like to connection lines formed of a different metal layer. The connection portion 23 has a contact hole that is an opening formed on an insulating layer interposed between metal layers to connect lines to each other through the opening. In a plan view, the connection portion 23 is disposed outwardly relative to the peripheral circuit 22 in the non-display area NAA, in which a large part of the connection portion 23 overlaps the seal 14 in a plan view. On the glass substrate 12G in the substrate non-overlapping area NOA of the array substrate 12, the base wiring portion 20 is disposed adjacent to the connection portion 23. Through connection lines arranged in the base wiring portion 20, the connection portion 23 is connected to driving components and signal transmitting components mounted on the base wiring portion 20.

As shown in FIGS. 2 and 3, the pixel circuit 21, the peripheral circuit 22, and the connection portion 23 of the array substrate 12 are overlaid with the flattening layer 28 on the upper layer side. The flattening layer 28 is composed of a first flattening layer (first organic insulating layer) 28A and a second flattening layer (second organic insulating layer) 28B. In the substrate overlapping area of the array substrate 12, the first flattening layer 28A and the second flattening layer 28B are formed substantially as solid layers in a range extending from the display area AA into the non-display area NAA. Each of the first flattening layer 28A and the second flattening layer 28B is made of an organic insulating material, such as an acrylic resin (e.g., PMMA), has a thickness larger than the thickness of a different insulating layer made of an inorganic material, and has a function of flattening a level difference formed on the lower layer side below the first flattening layer 28A and the second flattening layer 28B. The first flattening layer 28A is overlaid directly on the pixel circuit 21, the peripheral circuit 22, and the connection portion 23 to cover them from above and is disposed below the second flattening layer 28B. The second flattening layer 28B overlaid on the first flattening layer 28A is overlaid with the above-mentioned common electrode 25. The first flattening layer 28A and the second flattening layer 28B have contact holes formed as openings through which the pixel electrodes 24 are connected to the pixel circuit 21 in the display area AA. These contact holes are not shown in FIG. 2.

The liquid crystal panel 10 according to the first embodiment has a display function of displaying an image and a touch panel function (position input function) of detecting a user's input position based on a displayed image as well. A touch panel pattern for exerting the touch panel function is provided as an integrated pattern (in-cell pattern). This touch panel pattern is a so-called projection-type capacitance sensing touch panel pattern that senses a touch by a self-capacitance sensing method.

The touch panel pattern is provided on the array substrate 12 of the pair of substrates 11 and 12, and is made up of the touch electrodes (position detection electrodes) 26 arranged in a matrix pattern in the display area AA of the array substrate 12. The display area AA of the liquid crystal panel 10, therefore, substantially matches a touch area (position input area) where an input position can be detected. The non-display area NAA, on the other hand, substantially matches a non-touch area (position non-input area) where an input position cannot be detected. The user makes position input based on an image the user recognizes in the display area AA of the liquid crystal panel 10. When the user moves a finger (position input object) closer to the front surface of the liquid crystal panel 10, capacitance is created between the finger, which is a conductor, and touch electrodes 26. Now capacitance detected by a touch electrode 26 in close proximity to the finger changes as the finger moves closer to the touch electrode 26. The capacitance between the finger and this touch electrode 26 thus becomes different from capacitance between the finger and a touch electrode 26 located distant from the finger. This difference in capacitance allows detection of an input position.

As described above, according to the first embodiment, the common electrode 25 functions as the touch electrodes 26 during the image non-display period. More specifically, the common electrode 25 is divided into segments electrically independent of each other in a substantially tessellated pattern in a plan view, and each of the segments serves as the touch electrode 26. The touch electrodes 26 each have a square shape in a plan view. In the display area AA, rows of touch electrodes 26 are lined up in the direction of the X-axis and of the Y axis to form a matrix pattern of the touch electrodes 26, which overlap respectively a matrix pattern of the pixel electrodes 24 formed on the array substrate 12. To the touch electrodes 26, touch lines (position detection lines) 27 provided on the array substrate 12 are connected selectively.

The touch lines 27 extend along the direction of the Y-axis such that the touch lines 27 overlap and run parallel with the source lines on the array substrate 12, and are connected selectively to a specific group of touch electrodes 26 among the rows of touch electrodes 26 lined up in the direction of the Y-axis. The touch lines 27 are connected also to the driver 50 having a built-in detection circuit. The detection circuit may be disposed outside the liquid crystal panel 10 via a flexible substrate 60. The touch lines 27 supply reference potential signals related to the display function and touch signals (position detection signals) related to the touch function, to the touch electrodes 26 at different points of time. The reference potential signals are transmitted to all the touch lines 27 at the same point of time, causing all the touch electrodes 26 to have the reference potential. As a result, the touch electrodes 26 function as the common electrode 25.

As shown in FIGS. 2 and 3, the touch lines 27 are arranged on the first flattening layer 28A and below the second flattening layer 28B, and are formed of a third metal layer different from the metal layers making up the gate lines and source lines. The second flattening layer 28B interposed between the touch lines 27 and the touch electrodes 26 (common electrode 25) has touch line contact holes (position detection line contact holes) formed as openings through which the touch lines 27 are connected to the touch electrodes 26. The touch lines 27 extend substantially in the direction of the Y-axis to intersect all the touch electrodes 26, but are connected selectively to a specific group of touch electrodes 26 only in accordance with the planar location of the touch line contact holes. At the above connection portion 23, the touch lines 27 are connected to connection lines formed of a different metal layer.

Structural elements provided in the CF substrate 11 will be described.

As shown in FIGS. 2 and 3, on the inner surface (back surface or a plate surface facing the array substrate 12) of the glass substrate 11G of the CF substrate 11, a number of color filters 15 are arranged such that they overlap the pixel electrodes 24, respectively, in the display area AA. The color filters 15 are arranged such that sets of filters of three colors, i.e., red (R), green (G), and blue (B) are lined up alternately along the direction of the Y-axis and extend in the direction of the X-axis. The color filters 15 are thus arranged into a stripe pattern as a whole. On the inner surface of the glass substrate 11G, shading portions 16 (black matrix), each of which serves as a partition between adjacent color filters 15 to prevent color mixing or the like, are arranged in a range extending from the display area AA into the non-display area NAA. The shading portions 16 are arranged into a latticed pattern in the display area AA where the shading portions 16 overlap the gate lines and the source lines, but are formed into a solid film in the non-display area NAA. On the upper layer side (closer to the liquid crystal layer) above the color filters 15 and the shading portion 16, an overcoat layer (counter substrate side insulating film) 17 is formed. In the CF substrate 11, the overcoat layer 17 is formed substantially as a solid layer in a range extending from the display area AA into the non-display area NAA. Similar to the flattening layers 28A and 28B, the overcoat layer 17 is made of an organic material, such as an acrylic resin (e.g., PMMA), and has a function of flattening a level difference developed on the lower layer side below the overcoat layer 17. On the overcoat layer 17 in the display area AA, the photo spacers 18 are formed selectively in such a way as to project from the overcoat layer 17 in locations where the shading portions 16 are formed. The photo spacers 18 are made of, for example, the same material as the material making up the overcoat layer 17. The photo spacers 18 have their projection ends in contact with the array substrate 12, thus exerting a function of maintaining the given cell gap.

As shown in FIGS. 2 and 3, the innermost surfaces of the substrates 11 and 12, the innermost surfaces being in contact with the liquid crystal layer 13, are overlaid respectively with orientation layers 11M and 12M for orienting liquid crystal molecules included in the liquid crystal layer 13. Each of the orientation layers 11M and 12M is made of, for example, polyimide, and serves as a light orientation film that when exposed to light with a specific wavelength, such as UV-rays, orients liquid crystal molecules along a direction in which the light is emitted. The orientation layers 11M and 12M are formed respectively in the substrates 11 and 12, as solid layers that substantially extend across at least the whole display area AA. In other words, at least in the display area AA, the orientation layer 12M on the array substrate side covers structural elements including the pixel electrodes 24 from the upper layer side across the whole display area AA. At least in the display area AA, the orientation layer 11M on the CF substrate side covers the whole of the overcoat layer 17 and covers the photo spacers 18 from the upper layer side as well.

In the CF substrate 11 according to the first embodiment, a protective electrode layer 19 is formed on the outer surface (front surface or a plate surface opposite to the plate surface facing the array substrate 12) of the glass substrate 11G. On the outer surface of the protective electrode layer 19, the above-mentioned polarizer 11P is disposed. The polarizer 11P is formed to be slightly smaller than the glass substrate 11G. As a result, at a side edge of the CF substrate 11 in the substrate non-overlapping area NOA (the lower side in FIG. 1 and the left-hand side in FIGS. 2 and 3), the protective electrode layer 19 is exposed. The protective electrode layer 19 can be made of the same transparent electrode material as the material making up the first transparent electrode layer and second transparent electrode layer formed in the array substrate 12. The protective electrode layer 19 has a function of protecting the liquid crystal panel 10 from external noise, and is formed as a solid layer covering the whole outer surface of the glass substrate 11G (front surface of the liquid crystal panel 10).

Structural elements formed in the substrate non-overlapping area NOA of the array substrate 12 will then be described.

As shown in FIG. 2, in the substrate non-overlapping area NOA on the front surface of the glass substrate 12G, a base wiring portion 20 is disposed adjacent to the connection portion 23 disposed in the substrate overlapping area OA. The connection lines, to which the lines making up the peripheral circuit 22, the source lines, and the like are connected at the connection portion 23, are lead out of the connection portion 23, are routed in the base wiring portion 20, and are connected to a terminal for connection to mounted components or the like. This configuration is not described in detail here. In the base wiring portion 20, a ground line 36 is also routed, the ground line 36 supplying a ground voltage to each of members included in the liquid crystal panel 10. The ground line 36 is connected to a ground node via a flexible substrate 60 and the like, which will be described later.

According to the first embodiment, as shown in FIGS. 1 and 2, the driver 50 (panel driving component) and the flexible substrate 60 (signal transmitting component) are mounted on the front surface of the array substrate 12 in the substrate non-overlapping area NOA, as components for supplying various signals related to the display function and the touch panel function.

The driver 50 is composed of an LSI chip having a drive circuit built therein, and is mounted on the array substrate 12 by a chip-on-glass (COG) mounting method. The driver 50 processes various signals transmitted by the flexible substrate 60. The flexible substrate 60 is constructed by forming a number of wiring on a base material having insulation property and flexibility. The flexible substrate 60 is connected to the array substrate 12 of the liquid crystal panel 10 and to a signal source 80 disposed outside the liquid crystal panel 10, thus transmitting various signals output from the signal source 80 to the liquid crystal panel 10.

The driver 50 and the flexible substrate 60 are electrically and mechanically connected to a terminal and a terminal pad disposed on the front surface of the base wiring portion 20, via, for example, an anisotropic conductive film (ACF). The driver 50 and the flexible substrate 60 may be connected to the terminal and terminal pad via a connector or the like.

According to the first embodiment, in the substrate non-overlapping area NOA, a ground pad 30 (an example of the terminal pad) is formed on a terminal continuous with the ground line 36 routed in the base wiring portion 20. The ground pad 30 is a structural element that is connected to the ground node in order to supply a ground voltage to the protective electrode layer 19 formed in the CF substrate 11. As shown in FIGS. 1 and 3, conductive paste 39 is applied in such a way as to stretch from one end of the protective electrode layer 19 to the upper surface of the ground pad 30, thus connecting the protective electrode layer 19 to the ground pad 30. According to the first embodiment, on the lower layer side to the ground pad 30 (side closer to the base wiring portion 20 and the glass substrate 12G), a two-dimensional code 40 (an example of an information code) expressing information for identifying the liquid crystal panel 10 is placed such that the two-dimensional code 40 overlaps the ground pad 30. These structural elements and arrangements will hereinafter be described in detail with reference to FIGS. 3 to 5.

Figure 4A:
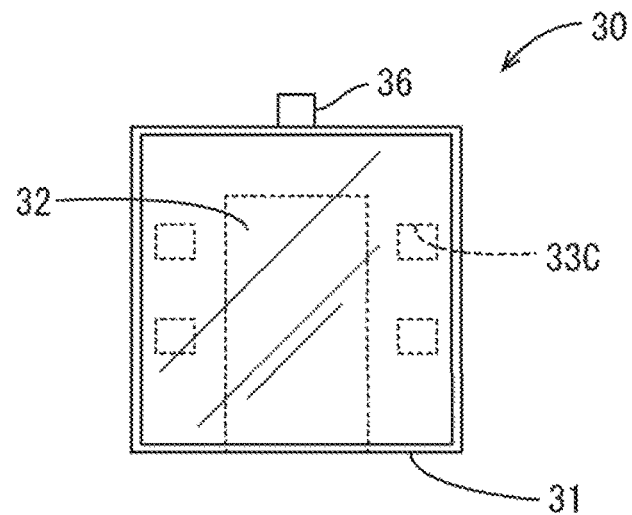
FIG. 4A is a diagrammatical view schematically showing a plan configuration of a ground pad.

The structure of the ground pad 30 will first be described in detail with reference to FIGS. 3, 4A, and 5.

As shown in FIG. 3, the ground pad 30 includes a metal portion 31 and a transparent electrode 32. The metal portion 31 is made of a metal material, and is formed on the upper surface of the base wiring portion 20, the upper surface being opposite to the surface of base wiring portion 20 that is in contact with the glass substrate 12G, such that the metal portion 31 is continuous with the ground line 36. As shown in FIG. 4A, the metal portion 31 according to the first embodiment is substantially of a U shape encircling an opening open in one direction (lower side in FIGS. 1, 4A, and 4C) in a plan view, being formed as a square frame shape encircling the two-dimensional code 40, which will be described later, on its three sides. The transparent electrode 32 is a light-transmitting portion configured to transmit visible light, and is made of a transparent electrode material. In a plan view, the transparent electrode 32 is a square almost as large as the metal portion 31 and is superposed on the metal portion 31 to close the opening formed inside the metal portion 31 from the upper layer side (front side). According to the first embodiment, as shown in FIGS. 3 and 5, an insulating film 33 made of a transparent insulating material is disposed between the metal portion 31 and the transparent electrode 32. The insulating film 33 according to the first embodiment is formed to extend across the whole substrate non-overlapping area NOA except areas where the terminal and terminal pad are formed. The insulating film 33 thus covers the metal portion 31, a metal base material 41 (which will be described later) of the two-dimensional code 40, and the upper surface of the base wiring portion 20 on which the metal portion 31 and the metal base material 41 are mounted. According to the ground pad 30 of the first embodiment, contact holes 33C are formed on the insulating film 33 disposed on the upper surface of the metal portion 31. In each of the contact holes 33C, a gap left by removing the insulating film 33 from the contact hole 33C is filled with a metal buried film 34, whose lower surface is in contact with the metal portion 31 and upper surface is with the transparent electrode 32. As a result, the protective electrode layer 19 of the CF substrate 11 is connected electrically to the ground line 36 via the conductive paste 39, the transparent electrode 32, the metal buried films 34, and the metal portion 31. Filling the contact holes 33C with the metal buried films 34 prevents a case where a flaw, such as contact breaking, develops on the transparent electrode 32 due to level differences at side edges of the insulating film 33. The metal buried films 34 are provided properly in accordance with a condition of the contact holes 33C.

The metal portion 31 can be made of, for example, the same material as the material making up the source lines and the gate lines formed of the first metal layer and the second metal layer, the source line and gate lines being formed in the above-mentioned pixel circuit 21. The insulating film 33 can be made of, for example, the same material as the material making up the first flattening layer 28A serving as the insulating layer. The metal buried films 34 can be made of, for example, the same material as the material making up the touch lines 27 formed of the third metal layer. The transparent electrode 32 can be made of, for example, the same material as the material making up the pixel electrodes 24 formed of the second transparent electrode layer. This allows a process of stacking the structural elements making up the ground pad 30 in order to be carried out simultaneously with a process of forming the layers making up the structural elements in the substrate overlapping area OA.

Figure 4B:
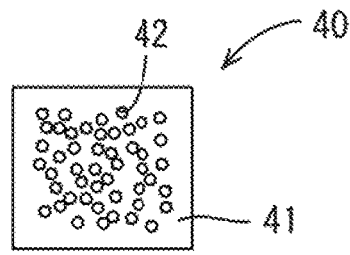
FIG. 4B is a diagrammatical view schematically showing a plan configuration of a two-dimensional code.

The structure of the two-dimensional code 40 will then be described with reference to FIGS. 3, 4B, and 5.

The two-dimensional code 40 according to the first embodiment carries information in two directions, i.e., the lateral (horizontal) direction and the longitudinal (vertical) direction. As shown in FIGS. 3 and 5, a number of circular holes 42 are formed on the metal base material 41 of a square made of a metal material, the metal base material 41 being disposed on the upper surface of the base wiring portion 20. The two-dimensional code 40 thus expresses various pieces of information in terms of the size, number, and location of the holes 42 formed on the metal base material 41. The metal base material 41 according to the first embodiment is formed into a square slightly smaller than the opening defined inside the metal portion 31 of the above-mentioned ground pad 30.

The metal base material 41 can be made of, for example, the same material as the material making up the metal portion 31. This allow a process of forming the metal base material 41 to be carried out simultaneously with a process of forming the source lines and gate lines formed of the first metal layer and the second metal layer in the substrate overlapping area OA and forming the metal portion 31 in the substrate non-overlapping area NOA. In these processes, the holes 42 can be bored as the source lines and gate lines are formed and routed by, for example, photolithography.

Figure 4C:
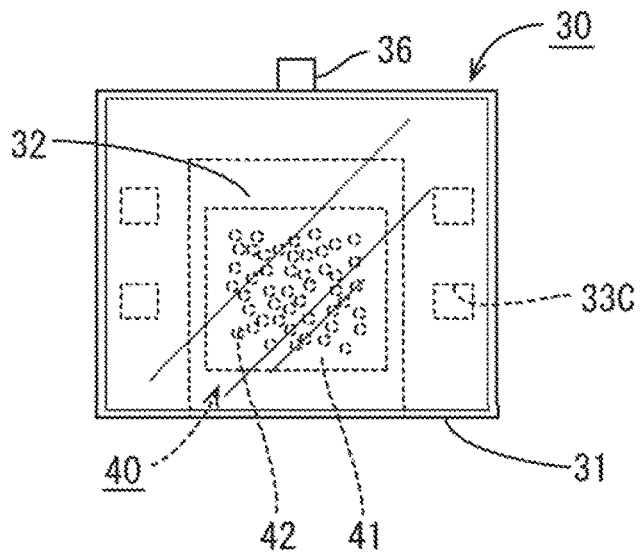
FIG. 4C is a diagrammatical view schematically showing a plan configuration of the ground pad and the two-dimensional code in overlapping arrangement.

Arrangement of the ground pad 30 and the two-dimensional code 40 relative to each other will then be described with reference to FIGS. 3, 4C, and 5.

The ground pad 30 and the two-dimensional code 40 are arranged in the substrate non-overlapping area NOA such that the ground pad 30 and the two-dimensional code 40 overlap each other in a plan view. According to the first embodiment, the transparent electrode 32 of the ground pad 30 is larger than the metal base material 41 of the two-dimensional code 40. As shown in FIG. 4C, the metal base material 41 is placed in the opening defined inside the metal portion 31 such that the metal base material 41 is not contact with, i.e., is separated from the metal portion 31. In this arrangement, the transparent electrode (light-transmitting portion) 32 covers the whole of the upper surface of the metal base material 41, and therefore, as the holes 42 of the metal base material 41 placed inside the metal portion 31 can be visually recognized from the upper surface of the ground pad 30, the ground pad 30 and the two-dimensional code 40 overlap each other.

Figure 5:
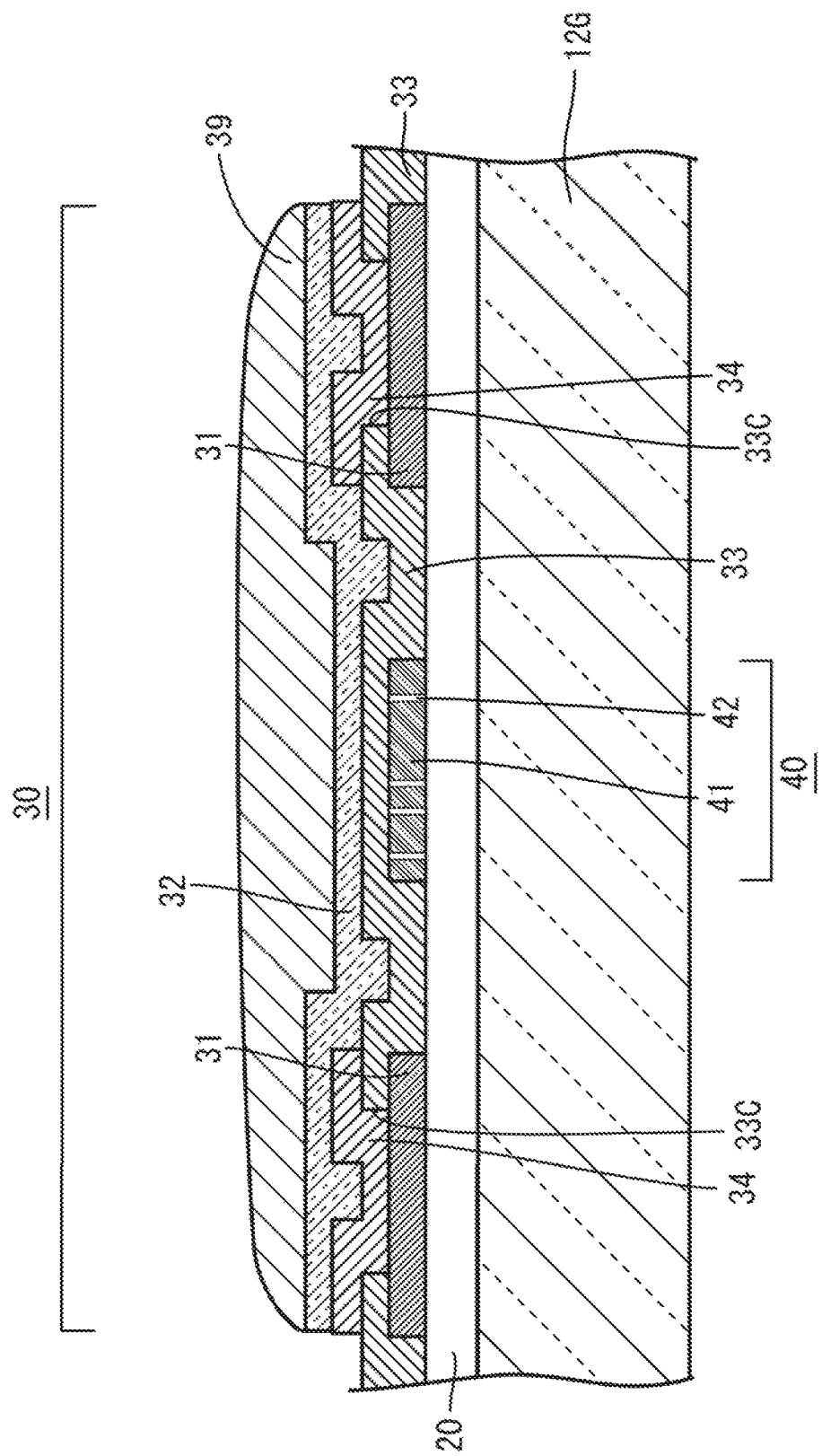
FIG. 5 is a diagrammatical view schematically showing a configuration of a section taken along a C-C line of FIG. 1.

As shown in FIGS. 3 and 5, in the same manner as the upper surface of the metal portion 31 is covered with the transparent electrode 32, the upper surface of the metal base material 41 is covered with the insulating film 33. However, because the insulating film 33 is made of a transparent material as the transparent electrode 32 is, covering the upper surface of the metal base material 41 with the insulating film 33 does not affects the visibility of the two-dimensional code. According to the first embodiment, the metal base material 41 is set electrically independent of the signal source 80 and the ground node.

As described above, the liquid crystal display device 1 according to the first embodiment includes the liquid crystal panel 10 (an example of the display means) including the CF substrate 11 (first substrate) and the array substrate 12 (second substrate), the liquid crystal panel 10 displaying an image according to an electric signal, the ground pad 30 (an example of the terminal pad) that electrically connects the protective electrode layer 19 (an example of a conductor) provided on the CF substrate 11 to the ground node, and the two-dimensional code 40 (an example of the information code) expressing information in an optically readable form. The array substrate 12 has the substrate overlapping area OA defined such that the substrate overlapping area OA overlaps the CF substrate 11 in a plan view, and the substrate non-overlapping area NOA defined such that, with one side edge of the array substrate 12 extending out from one side edge of the CF substrate 11, the substrate non-overlapping area NOA does not overlap the CF substrate 11. At least a part of the ground pad 30 serves as the transparent electrode 32 (an example of the light-transmitting portion) configured to transmit light. The ground pad 30 and the two-dimensional code 40 are disposed in the substrate non-overlapping area NOA on the front plate surface (one plate surface) of the array substrate 12, the front plate surface facing the CF substrate 11, such that the ground pad 30 and the two-dimensional code 40 overlap each other in a plan view and that the transparent electrode 32 covers the upper surface of the two-dimensional code 40.

According to the configuration of the first embodiment, the two-dimensional code 40 is disposed such that it overlaps the ground pad 30 in a plan view. As a result, the two-dimensional code 40 is placed in the substrate non-overlapping area NOA in a space-saving manner. The two-dimensional code 40 is disposed in the substrate non-overlapping area NOA on the front plate surface of the array substrate 12 such that the two-dimensional code 40 lies on the lower layer side to the transparent electrode 32 making up a part of the ground pad 30 (side closer to the base wiring portion 20 and the glass substrate 12G). This allows optically reading the two-dimensional code 40 from above the ground pad 30. Since the two-dimensional code 40 has its surface wholly covered with the transparent electrode 32, the two-dimensional code 40 is protected against contamination and damage. According to the configuration of the first embodiment, a wiring path leading from the structure in the substrate overlapping area OA to the base wiring portion 20 in the substrate non-overlapping area NOA can be provided as a wiring path similar to a conventional wiring path. This allows the liquid crystal panel 10 to be produced using existing production equipment and utilizing conventional knowhow. In the display device production process, the nontransparent conductive paste 39, which provides connection to the protective electrode layer 19, may be applied to the upper surface of the transparent electrode 32 of the ground pad 30 after formation of the two-dimensional code 40 and the ground pad 30. In such a case, by removing or wiping the conductive paste 39 away, using alcohol or the like, on a necessary basis, the two-dimensional code 40 can be optically read from above the ground pad 30, that is, from the front surface side of the liquid crystal panel 10. After the information is read, the conductive paste is applied again to the upper surface of the transparent electrode 32. This makes the liquid crystal display device 1 ready to be used. A plate material configured to transmit light is used as a substrate making up the array substrate 12. Usually, a transparent substrate, such as the glass substrate 12G, is used as such a substrate making up the array substrate 12. In this case, the two-dimensional code 40 can be read from the back surface side (the other plate surface side) of the array substrate 12, that is, the back surface side of the liquid crystal panel 10. For this reason, the glass substrate 12G is suitable for use in a reflective liquid crystal display device and an organic EL display device both of which do not require a backlight unit to be attached to the back surface side of the liquid crystal panel 10.

In this manner, according to the first embodiment, the two-dimensional code 40 that can be read easily after completion of the liquid crystal display device 1 can be placed in the substrate non-overlapping area NOA in a space-saving manner. As a result, efficient panel designing can be carried out as problems posed by a reduction in the substrate non-overlapping area NOA, which result from a modification in shape and a reduction in frame size of the liquid crystal panel 10, are dealt with. This allows, for example, management of traceability of the liquid crystal display device 1 (production/inspection history management).

In the liquid crystal display device 1 according to the first embodiment, the ground pad 30 has the metal portion 31 made of a metal material and connected to the signal source or the ground node, the transparent electrode 32 is made of a transparent electrode material and is electrically connected to the protective electrode layer 19 and the metal portion 31, and the two-dimensional code 40 has the metal base material 41 made of a metal material.

According to the above configuration of the first embodiment, the ground pad 30 and the two-dimensional code 40 can be formed using the same materials as materials usually used to form display panels.

In the liquid crystal display device 1 according to the first embodiment, the array substrate 12 has a metal layer (e.g., the first metal layer and the second metal layer making up the gate lines and the source lines) formed in the substrate overlapping area OA on the front plate surface, and a transparent electrode layer (e.g., the second transparent electrode layer making up the pixel electrodes 24) formed on the upper layer side above the metal layer. The metal portion 31 and the metal base material 41 are made of the metal material making up the metal layer, and the transparent electrode 32 is made of the transparent electrode material making up the transparent electrode layer.

The array substrate 12 further has an insulating layer (e.g., the first flattening layer 28A) made of a transparent resin material, the insulating layer being interposed between the metal layer and the transparent electrode layer. The insulating film 33 is made of the transparent resin material making up the insulating layer.

In the substrate overlapping area OA of the array substrate 12, a stack of layers made of various materials is formed. As a result, the pixel circuit 21 and electrodes for driving the liquid crystal panel 10 and lines or the like connected to the pixel circuit 21 and electrodes are provided in the substrate overlapping area OA in which an insulating layer that prevents short circuit between conductive layers is also provided. The lines or the like and the electrodes or the like are formed into various patterns by patterning the metal layer and the transparent electrode layer respectively by photolithography or the like. According to the configuration of the first embodiment, the metal layer, the insulating layer, and the transparent electrode layer are formed in the substrate overlapping area OA and, at the same time, the ground pad 30 and the two-dimensional code 40, which are made of the same material, are stacked in order as well. This simplifies the overall configuration and the production process.

In the liquid crystal display device 1 according to the first embodiment, the metal base material 41 is disposed such that, in a plan view, the whole of the metal base material 41 overlaps the transparent electrode 32.

According to this configuration, when the transparent electrode 32 of the ground pad 30 is larger in outline than the metal base material 41 of the two-dimensional code 40 as in the first embodiment, for example, the metal portion 31 is formed to encircle the metal base material 41 and the transparent electrode 32 is disposed in such a way as to cover the whole of the metal base material 41. This minimizes an area required for arranging the ground pad 30 and the two-dimensional code 40.

In the liquid crystal display device 1 according to the first embodiment, the ground pad 30 serves as a ground pad that electrically connects the protective electrode layer 19 to the ground node.

Even in a case where the two-dimensional code 40 made of a conductive metal is placed close to the ground pad 30 and may possibly have an effect on the conduction capability of the ground pad 30, a possibility that such an effect causes a problem with the ground pad 30 is relatively low because it serves as a ground circuit. The ground pad 30 is therefore preferable as a terminal pad disposed in such a way as to overlap the two-dimensional code 40.

In the liquid crystal display device 1 according to the first embodiment, the two-dimensional code 40 is a two-dimensional code that carries information in two directions, i.e., the vertical direction and lateral direction.

Although the two-dimensional code requires an area of a certain size, it can express a large amount of information. The technology described herein is particularly usable for placing the two-dimensional code 40 having a relatively large area on the substrate in a space-saving manner.

In the liquid crystal display device 1 according to the first embodiment, the liquid crystal panel 10 is a liquid crystal panel having liquid crystal molecules sealed between the CF substrate 11 and the array substrate 12.

The technology described herein is used in many fields and is particularly usable for liquid crystal display devices of which special forms and reduced frame sizes are in strong demand.

Second Embodiment

A second embodiment will be described in detail with reference to FIGS. 6 to 7. The first embodiment has been described as the configuration in which the transparent electrode 32 of the ground pad 30 is larger than the metal base material 41 of the two-dimensional code 40 and the metal base material 41 as a whole is covered with the transparent electrode 32. The second embodiment will be described as a configuration in which a metal base material of a two-dimensional code 240 is larger in outline than a transparent electrode 232 of a ground pad 230. In the first embodiment, the ground pad 30 and the two-dimensional code 40 are arranged in a state in which they can be separated from each other. In the second embodiment, in contrast, the ground pad 230 and the two-dimensional code 240 in a state of being integrated together are arranged in the substrate non-overlapping area NOA. The ground pad 230 and the two-dimensional code 240 according to the second embodiment will hereinafter be described. In the following description, the same structures and effects as described in the first embodiment will not be described repeatedly. This omission in description applies also to a third embodiment to be discussed later.

The second embodiment is different widely from the first embodiment in that the metal base material of the two-dimensional code 240 and a metal portion of the ground pad 230 are formed integrally as a metal film 250.

Figure 6:
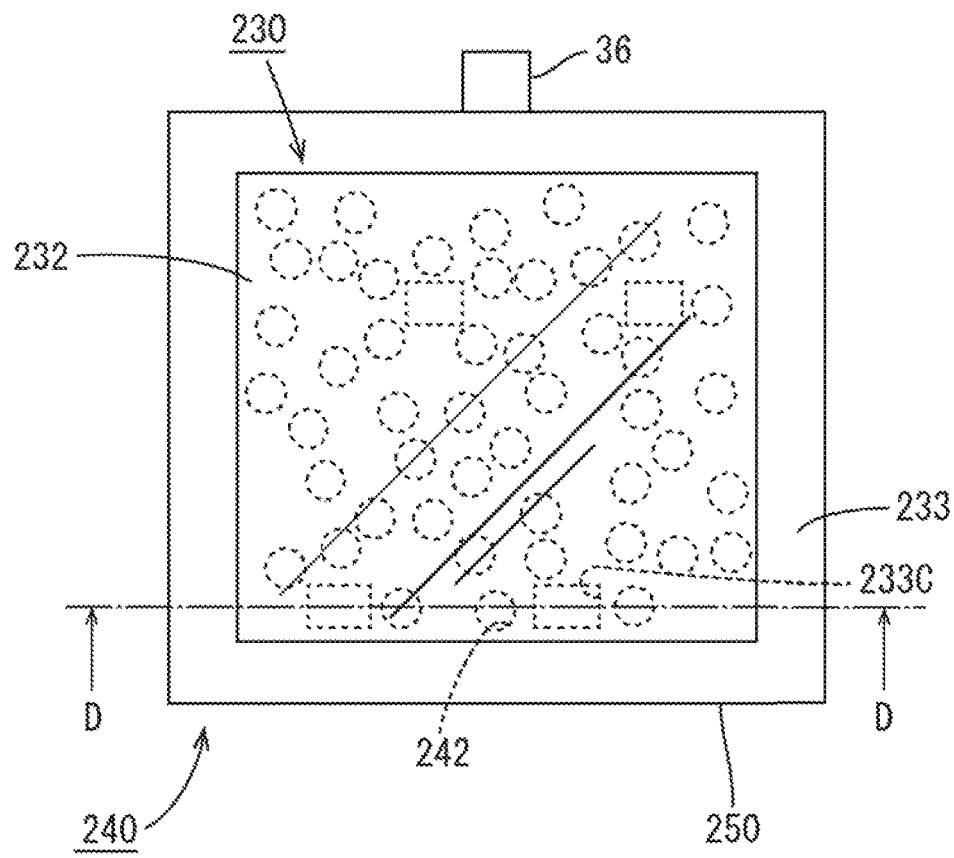
FIG. 6 is a diagrammatical view schematically showing a plan configuration of a ground pad and a two-dimensional code in overlapping arrangement according to a second embodiment (before conductive paste application).
Figure 7:
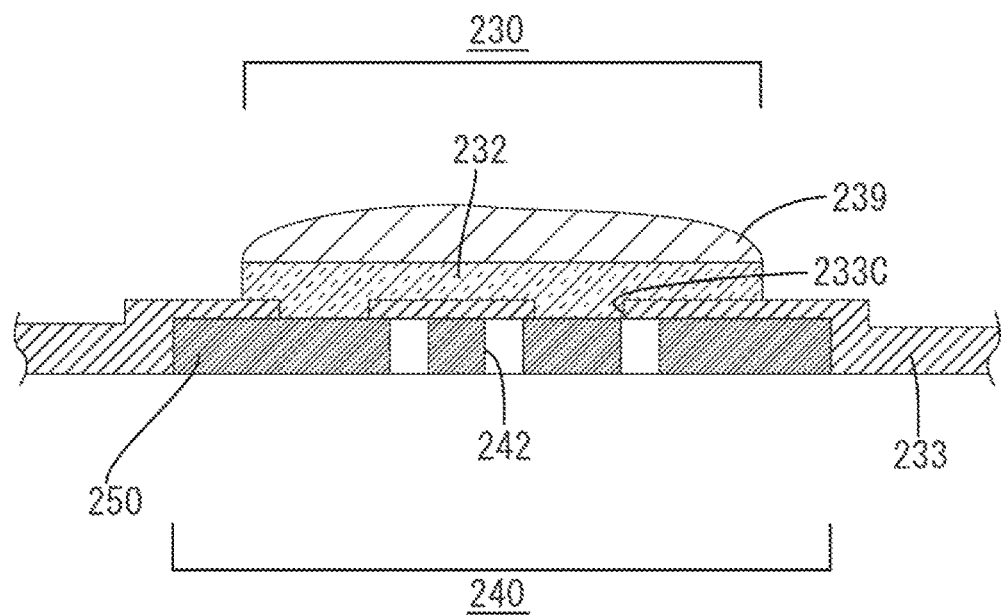
FIG. 7 is a diagrammatical view schematically showing a configuration of a section taken along a D-D line of the ground pad and the two-dimensional code of FIG. 6 that are coated with conductive paste.

As shown in FIG. 6, the metal film 250 is continuous with the ground line 36. On the upper layer side above the metal film 250, the transparent electrode (light-transmitting portion) 232 is disposed via an insulating film 233. As shown in FIG. 6, the transparent electrode 232 according to the second embodiment is formed into a square slightly smaller than the metal film 250 in a plan view. A part of the insulating film 233, the part overlapping the transparent electrode 232, has contact holes 233C each smaller than the transparent electrode 232. Through the contact holes 233C, the transparent electrode 232 is brought into contact with the metal film 250 and is therefore electrically connected to the metal film 250. As a result, the protective electrode layer 19 is connected to the ground node via conductive paste 239, the transparent electrode 232, the metal film 250, and the ground line 36. In this manner, the metal film 250 functions as the metal portion of the ground pad 230. As shown in FIG. 6, the metal film 250 of a square has a number of holes 242 bored at given locations to have a given size. These holes 242 express information to allow the metal film 250 to function as the metal base material of the two-dimensional code 240. FIGS. 6 and 7 depict the structure in which the part of insulating film 233 that overlaps the transparent electrode 232 has the contact holes 233C. The contact holes 233C according to the second embodiment are not filled with the metal buried film made of a non-transparent metal material, the metal buried film filling the contact holes 33C according to the first embodiment.

In the display device according to the second embodiment, the metal portion of the ground pad 230 and the metal base material of the two-dimensional code 240 are formed integrally as the metal film 250. In a plan view, the transparent electrode 232 is disposed such that the transparent electrode 232 as a whole overlaps the metal film 250.

According to the configuration of the second embodiment, when the metal base material of the two-dimensional code 240 is made larger in outline than the transparent electrode 232 of the ground pad 230 to allow the two-dimensional code 240 to carry a greater amount of information, for example, the ground pad 230 and the two-dimensional code 240 are put in the overlapping arrangement such that the whole of the ground pad 230 is within the area occupied by the two-dimensional code 240. This minimizes an area required for arranging the ground pad 230 and the two-dimensional code 240. In addition, the metal base material of the two-dimensional code 240 and the metal portion of the ground pad 230 are formed integrally as the metal film 250, that is, the metal film 250 is caused to function both as the metal base material of the two-dimensional code 240 and as the metal portion of the ground pad 230. This simplifies the overall configuration.

Third Embodiment

A third embodiment will be described in detail with reference to FIGS. 8 and 9. The third embodiment is different from the second embodiment in that a transparent electrode 332 of a ground pad 330 and a metal base material of a two-dimensional code 340 are formed such that the transparent electrode 332 and the metal base material are equal in outline with each other. The ground pad 330 and the two-dimensional code 340 according to the third embodiment will hereinafter be described.

According to the third embodiment, the metal base material of the two-dimensional code 340 and a metal portion of the ground pad 330 are formed integrally as a metal film 350.

Figure 8:
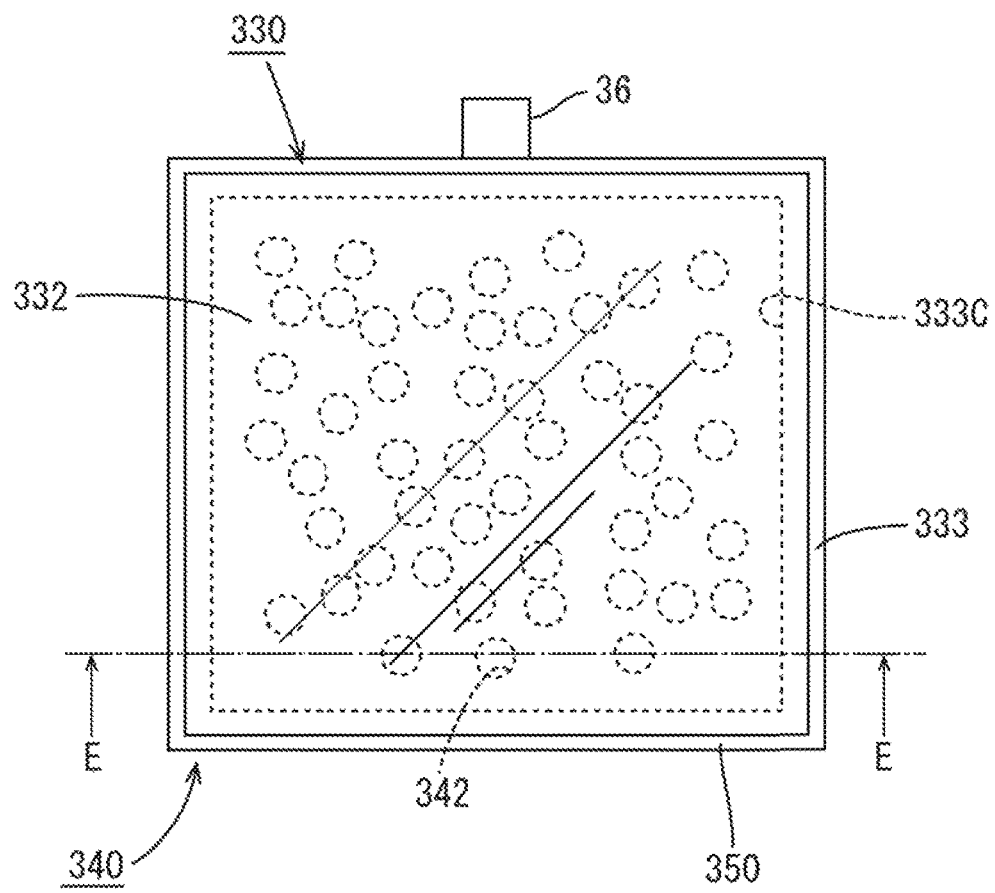
FIG. 8 is a diagrammatical view schematically showing a plan configuration of a ground pad and a two-dimensional code in overlapping arrangement according to a third embodiment (before conductive paste application).
Figure 9:
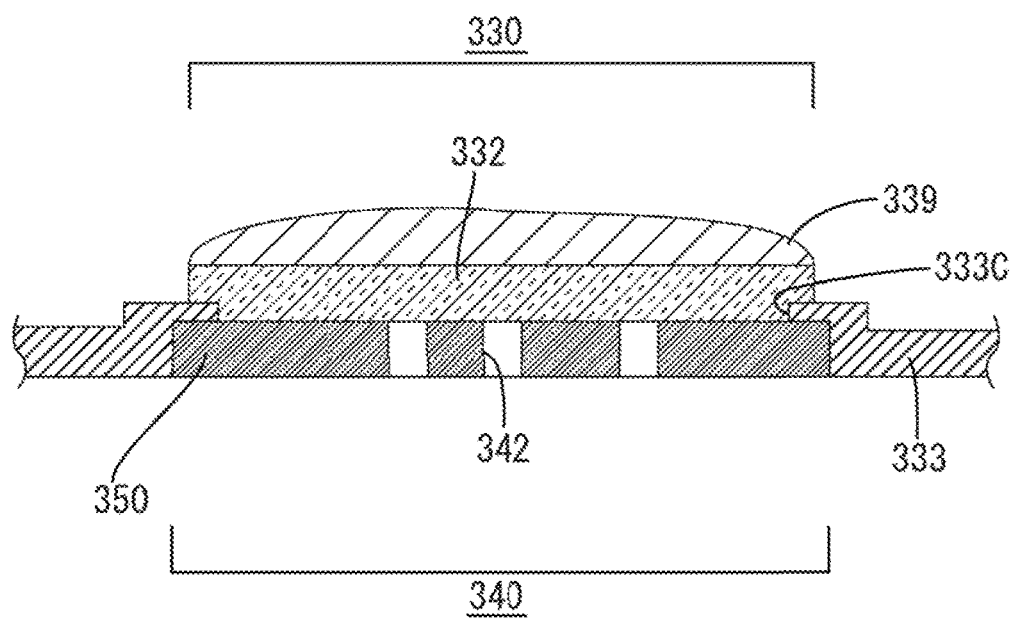
FIG. 9 is a diagrammatical view schematically showing a configuration of a section taken along a E-E line of the ground pad and the two-dimensional code of FIG. 8 that are coated with conductive paste.

As shown in FIG. 8, the metal film 350 is continuous with the ground line 36, and the transparent electrode (light-transmitting portion) 332 is disposed on the upper layer side above the metal film 350. As shown in FIG. 8, the transparent electrode 332 according to the third embodiment is formed into a square equal in size with the metal film 350 in a plan view. According to the third embodiment, a part of an insulating film 333, the part overlapping the transparent electrode 332 and the metal film 350, has a contact hole 333C through which the transparent electrode 332 is electrically connected to the metal film 350. As a result, the protective electrode layer 19 is connected to the ground node via conductive paste 339, the transparent electrode 332, the metal film 350, and the ground line 36. In this manner, the metal film 350 functions as the metal portion of the ground pad 330. As shown in FIG. 8, the metal film 350 of a square has a number of holes 342 bored at given locations to have a given size. These holes 342 allow the metal film 350 to function also as the metal base material of the two-dimensional code 340. As shown in FIGS. 8 and 9, the contact hole 333C according to the third embodiment is formed in such a way as to have a relatively large area substantially equal to the area of the transparent electrode 332 and of the metal film 350. Different from the contact holes 33C according to the first embodiment, the contact hole 333C is not filled with the metal buried film. The transparent electrode 332 is therefore brought into direct contact with the metal film 350 (metal portion) through the contact hole 333C. Since the contact hole 333C is not filled with the metal buried film made of a non-transparent metal material, the holes 342 located within the contact hole 333C can be visually recognized from above the transparent electrode 332.

As described above, in the display device according to the third embodiment, the metal portion of the ground pad 330 (an example of the terminal pad) and the metal base material of the two-dimensional code (an example of the information code) are formed integrally as the metal film 350, the metal film 350 as a whole overlaps the transparent electrode 332 (an example of the light-transmitting portion) in a plan view, and the transparent electrode 332 as a whole overlaps the metal film 350 in a plan view.

In other words, in a plan view, the outline of the transparent electrode 332 of the ground pad 330 substantially matches the outline of the metal film 350.

According to the configuration of the third embodiment, the two-dimensional code 340 and the ground pad 330 have the same shape and are arranged such that the two-dimensional code 340 and the ground pad 330 overlap with their outlines matched. The area of the substrate non-overlapping area NOA is thus used in a most efficient manner.

Other Embodiments

The technology described herein is not limited to the embodiments described above and with reference to the drawings. The following embodiments may be included in the technical scope.

(1) The terminal pad and the information code may be formed into various shapes in a plan view, such as arc, disc, fan, triangle, and indefinite shape, in line with a space that can be secured in the substrate non-overlapping area NOA.

(2) The liquid crystal panel may have no touch panel function, and the ground pad may be a pad that connects a conductor different from the protective electrode layer to the ground node. The technology described herein is applied widely not only to the ground pad for supplying the ground voltage but also to a terminal pad that connects the signal source to the conductor to supply various electric signals. In the above embodiments, the example in which the conductor and the terminal pad are connected through the conductive paste has been described. The method of connecting the conductor and the terminal pad, however, is not limited to this example. They may be connected electrically through a conductive tape.

(3) The technology described herein may also be applied to reflective liquid crystal panels and to other types of display panels, such as organic EL panels, plasma display panels (PDP), electrophoresis display panels (EPD), and micro electromechanical system (MEMS) display panels. In a case where the technology described herein is applied to the display device that does not require the backlight unit or the like to be attached to the back surface side (surface opposite to the image display surface) of the display panel, using a transparent substrate, such as a glass substrate, as a substrate making up the second substrate allows the information code to be read from the back surface side of the display panel even after the display device is completed. This is a particularly preferable configuration. In particular, the technology described herein is applied as a usable technology to the organic EL display device expected to be in wider use in a variety of fields.

(4) The technology described herein may also be applied to display devices having screen sizes ranging from 20 inches to 90 inches and classified as middle-sized or large (ultra-large) display devices.

The invention claimed is:

1. A display device comprising:
a display section including a first substrate and a second substrate, the display section displaying an image according to an electric signal;
a terminal pad that electrically connects a conductor provided on the first substrate or the second substrate to a signal source that supplies the electric signal or to a ground node; and
an information code expressing information in an optically readable form, wherein
the second substrate has a substrate overlapping area and a substrate non-overlapping area, the substrate overlapping area overlaps the first substrate in a plan view and the substrate non-overlapping area does not overlap the first substrate such that one side edge of the second substrate extends out from one side edge of the first substrate,
at least a part of the terminal pad serves as a light-transmitting portion configured to transmit light, and
the terminal pad and the information code are disposed in the substrate non-overlapping area on one plate surface of the second substrate, the one plate surface facing the first substrate, such that the terminal pad and the information code overlap each other in a plan view and the light-transmitting portion covers an upper surface of the information code.

2. The display device according to claim 1, wherein
the terminal pad has a metal portion made of a metal material and connected to the signal source or the ground node,
the light-transmitting portion is made of a transparent electrode material and is electrically connected to the conductor and the metal portion, and
the information code has a metal base material made of a metal material.

3. The display device according to claim 2, wherein
the second substrate has a metal layer formed in the substrate overlapping area on the one plate surface, and a transparent electrode layer formed on an upper layer side above the metal layer,
the metal portion and the metal base material are made of a metal material making up the metal layer, and
the light-transmitting portion is made of a transparent electrode material making up the transparent electrode layer.

4. The display device according to claim 2, wherein the metal base material is disposed such that the metal base material as a whole overlaps the light-transmitting portion in a plan view.

5. The display device according to claim 2, wherein
the metal portion and the metal base material are formed integrally as a metal film, and
in a plan view, the light-transmitting portion is disposed such that the light-transmitting portion as a whole overlaps the metal film.

6. The display device according to claim 1, wherein the terminal pad is a ground pad that electrically connects the conductor to the ground node.

7. The display device according to claim 1, wherein the information code is a two-dimensional code carrying information expressed in two directions of a vertical direction and a lateral direction.

8. The display device according to claim 1, wherein the display section is a liquid crystal panel having liquid crystal sealed between the first substrate and the second substrate.

9. The display device according to claim 1, wherein the display section is an organic EL panel having an organic EL material sealed between the first substrate and the second substrate.

* * * * *